United States Patent [19]

Key et al.

[11] 4,066,975

[45] Jan. 3, 1978

[54] AUDIO AMPLIFIER WITH IMPROVED STABILITY

[75] Inventors: Walter W. Key, McLean, Va.; Eugene L. Coggins, Malvern, Pa.

[73] Assignee: Paoli High Fidelity Consultants, Inc., Paoli, Pa.

[21] Appl. No.: 609,178

[22] Filed: Sept. 2, 1975

[51] Int. Cl.$^2$ .......................... H03F 1/36; H03F 3/28
[52] U.S. Cl. ..................................... 330/81; 330/122; 330/149
[58] Field of Search ................... 330/81, 82, 118, 119, 330/120, 122, 149

[56] References Cited

U.S. PATENT DOCUMENTS 2,815,407  12/1957  Hafler ................................. 330/118

OTHER PUBLICATIONS

Hafler et al., "Improving the Williamson Amplifier," Radio & Television News, Feb. 1953, pp. 43–45, 98, 100.

Primary Examiner—James B. Mullins
Attorney, Agent, or Firm—Barry A. Bisson

[57] ABSTRACT

In a wide-band electronic AC amplifier, the first stage is direct coupled to a split load phase inverter which is RC coupled to a push-pull power output stage and the output is obtained through transformer coupling with a portion being returned to the cathode of the input stage as negative feedback. Instability (e.g., generation of high frequency "parasitics") is prevented by reduction of the effective impedance of the phase splitter, as seen by the control grids of the output tubes, by greatly lowering the resistance thereof. Since the triode is DC coupled to the pentode, the values of the load resistor and the screen dropping resistor in the pentode section must be reduced in order to increase the high frequency response and keep the current flow in the triode section within the maximum safe limits of the tube design.

2 Claims, 2 Drawing Figures

AUDIO AMPLIFIER WITH IMPROVED STABILITY

SUMMARY OF THE INVENTION

In a wide-band width electronic AC amplifier, the first stage is direct coupled to a split load phase inverter which is RC coupled to a push-pull power output stage and the output is obtained through transformer coupling with a portion being returned to the cathode of the input stage as negative feedback. Instability (e.g., generation of high frequency "parasitics") is prevented by reduction of the effective impedance of the phase splitter, as seen by the grids of the output tubes, by greatly lowering the resistance thereof. Since the triode is DC coupled to the pentode, the values of the load resistor and the screen dropping resistor in the pentode section must be reduced in order to increase the high frequency response and keep the current flow in the triode section within the maximum safe limits of the tube design. Further stabilization is accomplished by use of high frequency negative feedback by connecting a capacitor between the anode and the grid of the triode section of the triode-pentode tube. Increase of the resistance of the grid resistors in the output tubes reduces their tendency to swing into a class $AB_2$ state when the tubes are near maximum current rating for a given static bias. Increase of the permanent minimal load connected across the secondary wingings of the output transformer can also aid in stabilization. Increase of the capacitance of the coupling capacitor between the phase splitter and the output tubes substantially lowers the low frequency capacitive reactance of the resulting RC network.

This invention relates to audio amplifiers of the high fidelity type, and more particularly to high fidelity, high gain audio amplifiers demonstrating sonic superiority which can be easily heard but which can not be as easily measured (e.g., "transparency", "detail", "open").

There are generally six accepted measures of high fidelity audio amplifier sonic performance: sine wave power output, steady state frequency response, square wave response, aggregate intermodulation distortion, aggregate harmonic distortion and maximum signal to noise ratio. Although particularly gross failures in any of these performance categories typically correlates with a poor sonic quality of a reproduced audio signal, the converse relationship does not necessarily apply. The present state of electrical measurement techniques as applied to high fidelity audio amplifiers is generally incapable of distinguishing highly accurate sonic quality in the amplified electrical signal from lesser quality. For this reason the judgment of trained listeners must be held as the best measure of accurate performance of sound reproduction components.

The discoveries described herein are a direct result of sonic evaluation with electrical measurements and analysis providing only the boundary constraints of the design.

In part, the present invention is an improvement of the amplifier described in U.S. Pat. No. 2,815,407 to David Hafler, issued Dec. 3, 1957. Essentially, the Hafler amplifier of U.S. Pat. No. 2,815,407 has been marketed for many years as the "Dynakit Mark III$^R$" by Dynaco Inc. The present invention incorporates some of the features of the Hafler amplifier but produces improved results, especially as to wider band width operation to provide transparency of reproduced transients as are found in complex waveforms, as in music reproduction.

Very wide band width (e.g., 80,000+$H_Z$) audio amplifiers of the tube type can have a tendency to generate high frequency parasitics and/or the low frequency phenomena known as "motorboating", particularly with loud speakers which present a predominantly inductive load to the output of the amplifier. Yet, a very wide high frequency band width is desired in an audio amplifier in order to provide superior reproduction of attack transients which extend down into the lower frequencies of the audio frequency spectrum (e.g., 1,000 $H_Z$ and below) as exemplified by a fast rise time (e.g., 2.4 microseconds at 10K $H_Z$) in reproducing a high frequency square wave response, which can be described in the reproduction of music as a more "transparent" sound.

Impedance is comprised of three types of reactance, resistive, inductive and capacitive. At certain frequencies, loud speakers tend to exhibit more of one of these reactances than of another, and can be classified as primarily inductively reactive or resistively reactive or capacitive reactive, as can be shown by vector analysis. Most commercially available loudspeakers present load impedances to the amplifier which are predominantly inductively reactive.

The output stage of an amplifier in accordance with the present invention can consist of either two type 8417 tubes or type 6550 tubes in push-pull, matched at 4300 ohms plate to plate with a transformer. This stage, without feedback, is capable of delivering 50 watts over the sonic frequency range of 20 Hz to 20,000 Hz but with unacceptably high distortion. The screen grids should be powered by an independent power supply having a low internal impedance throughout the frequency range of d.c. to 100,000 Hz. Independently controllable, fixed bias is supplied to the control grids of the output stage in order to maintain class $AB_1$ operating conditions. The sonic quality of this amplifier is relatively insensitive to the bias conditions as long as class $AB_1$ operation is preserved and a reasonably good d.c. balance is preserved between the output tubes. Independent adjustment also provides a method of compensating for unequal static operating points of each tube. Matched output tubes are not required.

The output stage is driven directly from a phase inverter of the split load type by employing the triode section of a 6AN8A tube. Although the cathode section of this type of inverter has a slightly better high frequency response than the plate section, the difference is inconsequential with frequencies less than 100,000 Hz and therefore no compensating networks are included which could introduce other detrimental effects.

The phase inverter is driven by the other half of the 6AN8A, which is employed as a high gain voltage amplifier, which with an un-bypassed cathode provides a gain of 200. This input stage has a relatively high resistor in series with the input grid to improve its overload characteristics in the event of saturation. Direct coupling is used between the pentode section and the phase inverter. The plate load is bypassed with a series resistor and capacitor combination to reduce its high frequency gain above 20,000 Hz.

Although the general characteristics of 8417 tubes and 6550 tubes are similar, there is a marked difference in their dynamic and static control grid voltage sensitivity. Wide range d.c. bias controls should be included to satisfy the static requirements.

Only two forms of negative feedback need be employed. The first is a small amount of a.c. and d.c. cathode degeneration in cathode of the input stage. The primary form is obtained by supplying a portion of the output signal from the secondary of the output transformer and returning it to a section of the un-bypassed cathode resistor of the input stage. The amount of and the control of this feedback signal is critical to the sonic performance of the amplifier. Using 8417 tubes, the feedback is 29 decibels and using 6550 tubes, it is 26 decibels in midband because difference in the amplifier's forward (open loop) gain with each pair of tube types. The percentage of output voltage fed back is increased and shifted in phase above approximately 50,000 Hz. The compensation applied to the voltage fed back is determined by an inverse matching of the output transformer's high frequency characteristics alone. The closed loop flat frequency response exceeds 80,000 Hz.

The low frequency response is controlled by decoupling the screen grid of the input stage. A 0.1 mfd. capacitor is connected between the screen grid and cathode. This capacitor is connected between the screen grid and cathode. This capacitor provides a relatively low impedance path for signals over 20,000 Hz. For frequencies less than 20 Hz, the capacitor's reactance increases thus allowing signal voltage to exist on the screen grid and thereby lowering the affective gain of this stage without introducing any phase shift.

As previously mentioned, a separate power supply of conventional design is provided fo the screen grids of the output tubes. All other B plus voltages are obtained from a solid state, very low impedance power supply. Rectifying and filtering is achieved without the use of resistors or inductors. The effective capacitance across the output of the supply is 1000 mfd. The full load to quiescent load voltage variation is 20 volts. The charging of the power supply capacitors is controlled by a temperature dependent resistor in the primary of the power supply transformer.

Since the circuit design produces an amplifier which exhibits a very wide band width, the potential problem of high frequency parasitics has to be overcome if the above-mentioned loudspeakers with load impedance of the inductive type are to be used with this amplifier. The following changes are employed to the basic amplifier circuit to provide a significant improvement to the original design.

1. Reduce the effective impedance of the phase splitter as seen by the control grids of the output tubes (e.g., 8417). This is accomplished by greatly lowering the resistance value of the matched phase splitter resistor (e.g., from 47Kohms to 15,000 ohms). Since the triode is DC coupled to the pentode, the values of the load resistor and the screen dropping resistor in the pentode section must be reduced in order to increase the high frequency response and keep the current flow in the triode section within the maximum safe limits of the tube design. 2. Further stabilizing steps are applied to the circuit in the form of high frequency negative feedback by connecting a capacitor of very samll value, e.g., 3.3 mmfd Sprague ® NPO, between the anode and grid of the triode section of a tube such as the 6AN8A. Also, by using this technique, the amount of high frequency reduction (frequencies considerably above the audio range) through a capacitive load on the output of the pentode section of a tube such as the 6AN8A is greatly reduced (e.g., from 30 mmfd to 5 mmfd), providing more band width.

3. The resistance value of the control grid resistors in the output tubes (e.g., two 8417 or 6550 tubes) is increased, e.g., from 1000 ohms to 2200 ohms. This reduces the tendency of the output tubes to swing into a class $AB_2$ state when the tubes are nearing their maximum current rating.

4. When certain speakers are connected to the amplifier output, the load impedance of the speaker drops excessively at certain frequencies, as seen by the output transformer; this is compensated by increasing the amount of permanent minimal load connected across the secondary windings of the output transformer for example, by reducing the value of the output load resistor from 680 ohms to 400 ohms.

A further sonic improvement which can be made to the amplifier described in FIG. 1, is to reduce the capacitive reactance at low frequencies of the RC coupling network between the triode and the push-pull power amplifier sections. By increasing the capacitance value of the output coupling capacitor from 0.25 mfd to 2.0 mfd, the capacitive reactance goes down for low frequencies and at the same time, the RC time constant developed through the output coupling capacitor and the output control grid resistor in the bias power supply circuit.

ILLUSTRATIVE EXAMPLES

Figure 1:
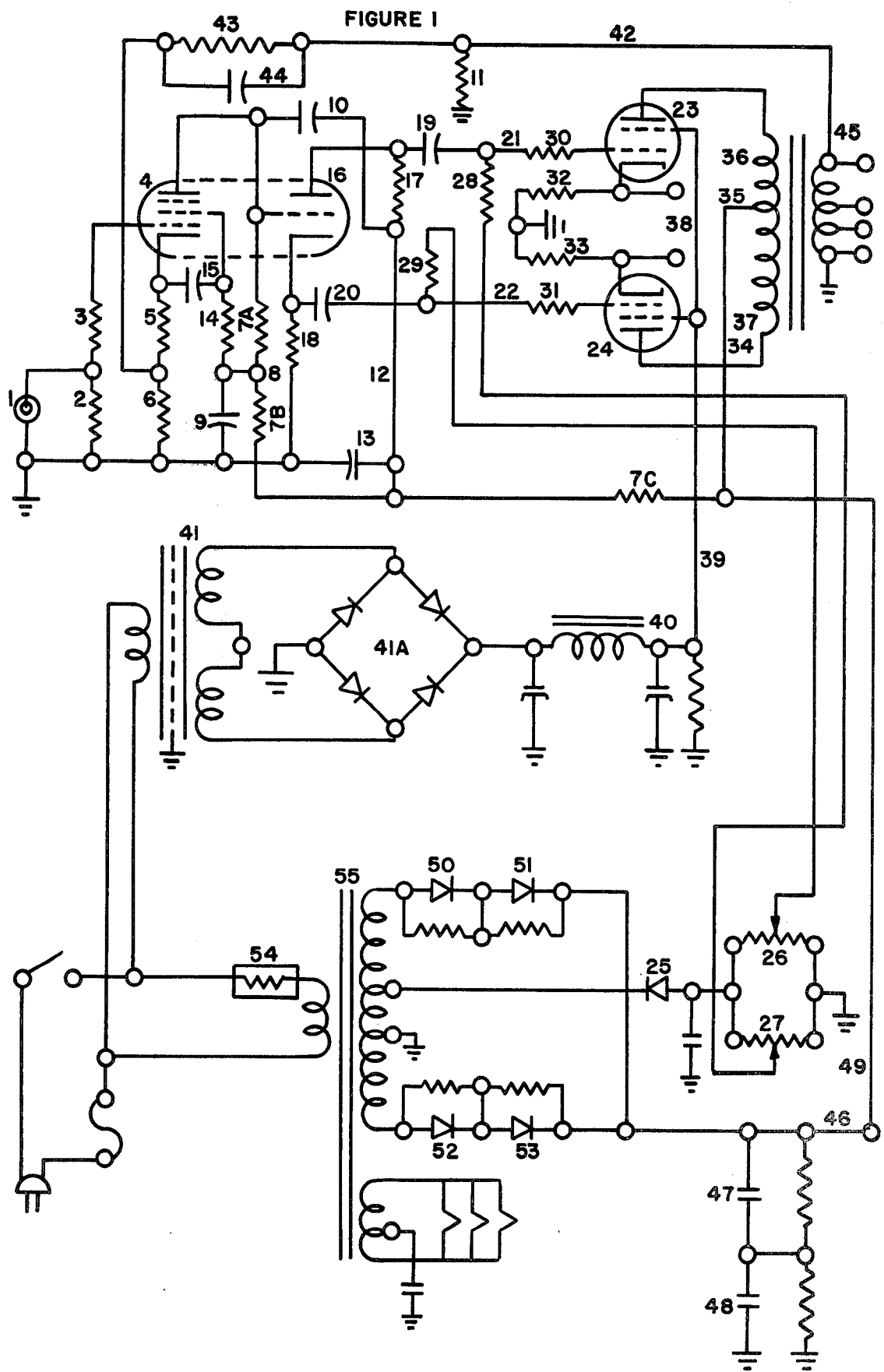
FIG. 1 is a schematic circuit diagram of a modification of the Hafler amplifier of U.S. Pat. No. 2,815,407 which exhibited instability

Example 1 shows a wide band width audio amplifier which utilizes some of the features of the amplifier in U.S. 2,815,407 to Hafler. Although this amplifier performed well with some speakers exhibiting a resistive load impedance (such as the Magnaparr Corporation's Magneplanar ® marketed by Audio Research Corporation), it exhibited instability (parasitics and motorboating) with other speakers which have high inductive impedance characteristics (e.g., "FMI J-Modular" marketed by Fulton Musical Industries).

Example 2 shows how the Example 1 amplifier was modified in accordance with the present invention to significantly reduce the tendency toward instability.

Example 3 shows a preferred embodiment of the present invention which incorporates the improvement of Example 2 and which provides two channels of amplification (e.g., for stereo reproduction).

EXAMPLE 1

A. An audio amplifier was constructed in accordance with FIG. 1 of the accompanying drawings. Many of the components of the amplifier were obtained from a Dyna Kit Mark III ®. The screen grid loading in the output stage of the Hafler amplifier shown in the drawing of U.S. Pat. No. 2,815,407 was removed and replaced with a low impedance source of d.c. power. The multi-stage capacitive feedback loop was removed to reduce the frequency imbalance in the push-pull output stage. The amount of feedback in the overall loop through the increased forward gain of the new output stage was increased to reduce distortion while maintaining the closed loop voltage sensitivity and this feedback was compensated in accordance with the inverse characteristics of the output transformer to increase the high frequency closed loop response. Bypass the input stage's plate load resistance to achieve high frequency gain control above 20,000 Hz.

Independent d.c. biasing was provided for the output stage to eliminate the requirement for d.c. matched tubes, allowing the use of 6550, 8417 and KT-88 type tubes and achieve greater tube life. A 33,000 ohm resistor is added in series with the input stage control grid to control overload characteristics by increasing the effective bias when small amounts of grid current flow. The tube rectifier and LC filter in the B plus power supply are eliminated and replaced with solid state rectifiers and a high capacitive, low impedance filter with less than 10 mv of a.c. ripple and plus or minus 10 volts d.c. regulation. A temperature dependent surge resistor was included in the power transformer primary to reduce the initial charging current.

Figure 2:
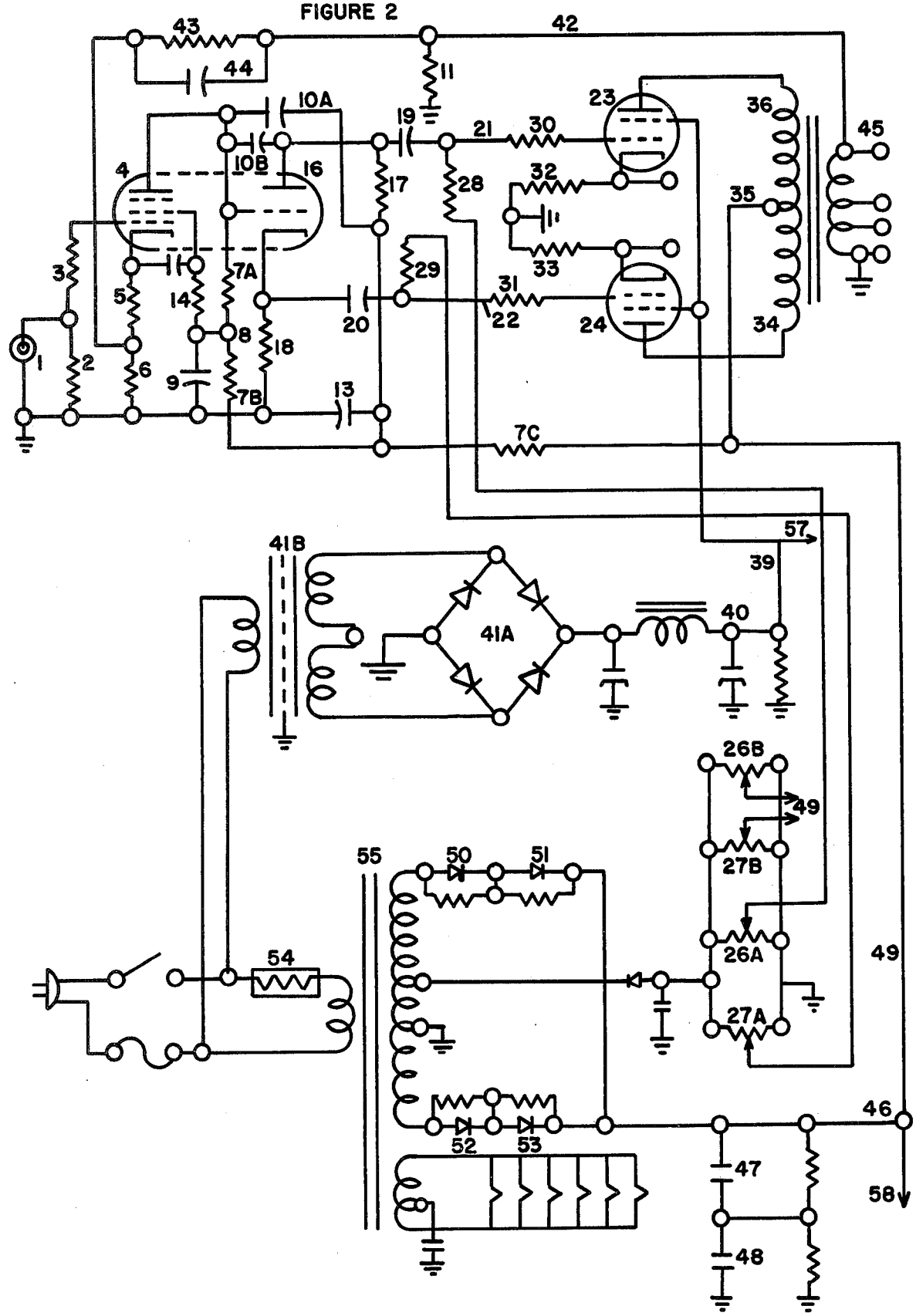
FIG. 2 is of a preferred embodiment of the present invention in which such instability has been significantly reduced.

FIG. I of the drawings is a schematic circuit diagram of a modification of the Hafler amplifier which exhibited instability and FIG. 2 is of a preferred embodiment of the invention in which such stability has been significantly reduced.

Referring now more particularly to the accompanying drawings, the reference numeral 1 denotes an input terminal from which a grid leak resistance 2 extends to ground. The terminal 1 is connected through a second grid leak resistance 3 to the control grid of pentode 4, having in its cathode circuit a relatively high un-bypassed resistance 5 in series with a relatively low un-bypassed resistance 6. The pentode 4 is anode loaded by a resistance 7 connected to a.d.c. voltage lead 8, the latter bypassed to ground by a capacitor 9. B+ voltages to both the pentode (4) and triode (7) are derived through dropping resistors (7B, 7C) connecting to the main B+ supply (49). In addition a capacitor 10A is connected from the anode of pentode 4 to d.c. voltage lead 12, the latter bypassed to ground by a capacitor 13. The screen grid of pentode 4 is loaded by a resistance 14 and directly coupled to cathode by a capacitor 15.

The anode of pentode 4 is directly connected to the grid of a triode 16 which occupies the same envelope as the pentode 4. The triode 16 has an anode load 17 and a cathode load 18 of equal values. Anode output voltage is derived via a capacitor 19 and cathode output voltage via capacitor 20, the two output voltages being of opposite phases due to their points of derivation.

The push-pull signal existent at leads 21 and 22 is applied to the grids of a pair of push-pull connected pentodes 23 and 24, connected and biased as a push-pull class $AB_1$ power output stage although a limited amount of class $AB_2$ may be employed instead.

The control grids of pentodes 23 and 24 are independently negatively biased from an auxiliary negative bias supply 25 having two variable potentiometers 26 and 27 to permit independently adjustable, wide range bias control to a variety of types of pentodes 23 and 24. The taps of each potentiometer 26 and 27 are connected through equal resistances 28 and 29 to grid leads 21 and 22. Grid leads 21 and 22 are connected to the control grids of pentodes 23 and 24 through two equal protective resistances 30 and 31.

The cathodes of pentodes 23 and 24 are connected to ground through two equal resistances 32 and 33 to ground. Although the voltage drops across these resistances contribute very little negative bias, they are used to monitor the cathode current in pentodes 23 and 24 while adjusting potentiometers 26 and 27.

The filtered B plus voltage appears on a lead 34 which is connected directly with the center tap or common point 35 of primary winding halves 36 and 37. The latter are connected, respectively, in series with the anodes of pentodes 23 and 24.

The screen grids of pentodes 23 and 24 are connected together by lead 38. The junction of the screen grids formed by lead 38 is connected through lead 39 to a separate low impedance power supply 40 of conventional design employing a full wave bridge rectifier 41 A, supplied by transformer 41.

An RC negative feedback loop 42 including a resistance 43 and a capacitor 44 in parallel is provided between the secondary winding 45 of the output transformer and the junction of cathode resistance 5 and 6. This feedback loop is critical to the successful performance of the amplifier. Resistance 43 establishes the amount of feedback in audible frequency range. Capacitor 44 compensates for the amplitude and phase degradation of the output transformer alone. The value of capacitor 44 must be determined in accordance with the type of output transformer employed.

The B plus power supply 46 has very low internal impedance. B plus filtering is achieved solely through the series connection of high capacitances 47 and 48 from lead 49 to ground. Low impedance diodes 50, 51, 52 and 53 are employed in a conventional full wave rectifying configuration. A temperature sensitive, surge resistance 54 is connected series with the primary winding of power transformer 55 to control the initial charging current needed to charge the series combination of capacitors 47 and 48. The absence of resistance inductor in the filter of B plus power supply 46 combined with the high energy storage capability of capacitors 47 and 48 result in very good instantaneous voltage regulation.

Low distortion and overall sonic quality are very dependent upon the negative feedback through loop 42. The value of capacitor 44 is determined by adjusting the RC time constant of 43 and 44 to achieve an inverse response to the amplitude and phase characteristic of the output transformer 45. The value of resistance 43 determines the nominal amount of feedback. Although the value of 1000 ohms shown in the example described in the U.S. Pat. No. 2,815,407 is less than the 1500 ohms shown in the present embodiment, the effective amount of feedback is 6 decibels greater, because of the improved forward gain measured under open loop conditions. To maintain stability with the greatly increased amount of feedback, the low frequency roll-off point is determined by capacitor 15. The high frequency response must be controlled in such a manner as to affect each pentode 23 and 24 equally. Because the minor frequency response difference between the cathode and anode portions of the triode phase inverter 16. To do so requires any high frequency compensation to occur prior to the phase inverter stage. The capacitor 10 acts as a relatively low impedance shunt across the pentode 4 anode load resistance 7. A permanent minimal load resistor(11) is connected across the output of transformer 45.

Values of circuit elements employed in one practical embodiment of the invention are as follows:

| Tube types: | |
|---|---|
| 4, 16 | 6AN8A |
| 23, 24 | 8417 |

-continued

| Resistances: | |
|---|---|
| 2 | 470K ohms |
| 3 | 33K |
| 5 | 680 |
| 6 | 47 |
| 7 | 270K |
| 11 | 680 |
| 14 | 1.5 Meg |
| 17 | 47K |
| 18 | 47K |
| 26 | 25K |
| 27 | 25K |
| 28 | 100K |
| 29 | 100K |
| 30 | 1000 |
| 31 | 1000 |
| 32 | 10 |
| 33 | 10 |
| 43 | 1500 |
| Capacitors: | |
| 9 | 20 mf |
| 10 | 30 mmf |
| 13 | 20 mf |
| 15 | 0.10 mf |
| 19 | .25 mf |
| 20 | .25 mf |
| 44 | 1800 mmf |
| 47 | 2000 mf |
| 48 | 2000 mf |

The audio amplifier of this example had a frequency band width which was 3 d.b. down at 80,000 Hz at full power (50 watts). Measurements taken at full power output just prior to clipping (63.8 watts or 22.6 V rms into an 8 ohm non-inductive resistive load) showed very good square wave reproduction, harmonic distortion of 1.0% and phase relationship at 10 K $H_z$ was 8.6°. When connected to Magneplanar ® speakers it performed well in use testing, especially in reproducing music, and was audibly better than a DynaKit Mark III ®. However, when connected to a Fulton FMI-J Modular ® speaker this amplifier generated parasitics and, in some cases, motorboated. Similarly, high frequency instability (parasitics) was observed with the FMI 80 ®, FMI 100 ®, FMI 120 ®, some B&O loudspeakers, IMF Monitor ® and the IMF Studio ®.

EXAMPLE 2

After considerable experimentation, it was discovered that the high frequency parasitics could be substantially reduced by adding a small capacitance between the low voltage side 19 of the coupling-capacitors 19, 20, and ground. This was initially unexpectedly discovered through experimentation by touching the coupling capacitor on the anode side of the phase splitter. Conversely, when the coupling capacitor on the cathode side of the phase splitter was toughed with a finger, high frequency parasitics greatly intensified. This phenomena on the anode side can be considered as adding a high frequency filter to the decoupling capacitor, thereby providing a filter for the high frequency parasitics. Also, wrapping four turns of insulated wire around the anode coupling capacitor and terminating one end to chassis ground provided a similar filter for the parasitics. However, it was considered that a better practice was to utilize a small commercial capacitor, (e.g., in the order of about 100 mmf).

One approach tried was to connect a small value (56 mmf) capacitor between the input grid of the output tube (23) and chassis ground. This was effective in reducing high frequency parasitics; however, an undesirable reduction of frequency band width was observed.

After further experimention the amplifier of Example 1 was ultimately modified as follows, in order to improve stability (e.g., reduce parasitics and eliminate motorboating with inductive speaker loads):

Each of the two 47,000 ohm, 1 watt phase splitter resistors (17, 18) were replaced with a 15,000 ohm 2 watt resistor which were matched in absolute value. The 270,000 ohm anode load resistor (7A) was replaced with 180,000 ohms. The 1,500,000 ohm screen dropping resistor (14) was replaced with a 1,000,000 ohm resistor. The 30 mmfd high frequency reducing load capacitor (10) was replaced with a 5.0 mmfd capacitor. The 680 ohm permanent minimal load resistor (11) was changed to 400 ohms, 2 watt. In addition, a 3.3 mmfd capacitor was connected between the anode and the grid of the triode section (16) of the 6AN8A. Each of the 1000 ohm grid resistors (30, 31) going to each of the 8417 output tubes (23, 24) was replaced by 2,200 ohm resistors.

To improve the amplifier's low frequency performance, each of the two 0.25 mfd coupling capacitors (19, 20) was replaced by a 2.0 mfd capacitor.

While we have described and illustrated specific embodiments of our invention, it will be clear that variations of the general arrangement and of the details of construction which are specifically illustrated and described may be resorted to without departing from the true spirit and scope of the invention.

In understanding the advantages and objectives of the present invention, the traditional amplifier specifications should not be the only criteria. The primary advantages are discovered only by the careful evaluation of the auditory performance of the amplifier when used in a high quality, total sound reproduction system. For example, the presence of a small amount of ultrasonic ringing on the top and bottom of a high frequency square wave has in the prior art been eliminated by a technique to reduce the high frequency forward gain, yet this yields an audible high frequency deficiency in the normal closed loop configuration irrespective of the measured flatness of the steady state sinusoidal response.

Accordingly, some advantages of the invention described herein relate to improvement in the basic amplifier system described by David Hafler in U.S. Pat. No. 2,815,497, in order to produce more accurate sonic performance, extended high frequency response and stability to generation of high frequency parasitics when connected to a highly inductive speaker. Also advantageous are the direct adaptability to a variety output tubes types such as the 8417, elimination of the requirement for matched tubes and greater output tube life.

Another advantage relates to providing an amplifier having a negative feedback loop which encompasses the output transformer and provides compensation for the amplitude and phase characteristics of the transformer alone.

It is a still further advantage that improved transient response has been provided through the use of more stable power supply voltages and overload biasing procedures.

The amplifier of Example 1 is the sole invention of Walter W. Key and was reduced to actual practice prior to the conception of the present invention.

EXAMPLE 3

The principles of the Example 2 amplifier can be readily utilized to make a stereo amplifier, by making the following changes, as illustrated in the accompanying FIG. 2:

The stereophonic arrangement combines two single channel amplifiers and a single power supply for both amplifiers.

In FIG. 2, transformer 55 is similar to that in FIG. 1, except that its maximum current rating is doubled. B + voltage for the other channel (not shown) is taken from point 56. Likewise, the screen voltage supply for the other channel (not shown) is taken from point 57. Two additional potentiometers, 26B and 27B, provide a static bias voltage supply to the output tubes of the other amplifier (not shown). The values of these pots, 26A, 26B, 27A and 27B are doubled (e.g., 50K ohms) in order to provide the same voltage range required for each output tube. In addition, filament voltages are taken from the secondary windings of the power transformer.

What we claim is:

1. In an audio amplifier including a single ended pentode preamplifier stage having a resistive and capacitive anode load and an unbypassed cathode resistive, a split load phase inverter having an anode, a cathode and a control grid, the control grid connected in cascade with the anode of said preamplifier stage, a push-pull power amplifier driven by said phase inverter such that one side of said power amplifier is driven from the cathode of said split load phase inverter and the other side of said power amplifier is driven from the anode of said split load phase inverter, said push-pull power amplifier including an output transformer having two primary windings each connected in one of said sides and a secondary winding from which a negative feedback loop terminates at the un-bypassed cathode resistance of the pentode preamplifier stage, and wherein high frequency parasitics are generated when said amplifier is connected to a loudspeaker which exhibits an impedance which is highly inductive, the improvement wherein said parasitics are substantially reduced by providing a means of lowering of the effective impedance of the phase splitter, as seen by the input of the push-pull power amplifier.

2. An audio amplifier as described in claim 1 and wherein the low frequency response has been improved by lowering the capacitor reactance in the RC coupling network between the output of the phase splitter and the push-pull power amplifier, whereby the time constant of the coupling network is maintained, thus minimizing both low and high frequency perturbation in the audio spectrum.

* * * * *